United States Patent [19]
Guo

[11] Patent Number: 5,663,903
[45] Date of Patent: Sep. 2, 1997

[54] FLAT-CELL READ-ONLY MEMORY

[75] Inventor: Jeng-Jong Guo, Hsin-Chu, Taiwan

[73] Assignee: Utron Technology Inc., Hsin-Chu, Taiwan

[21] Appl. No.: 508,532

[22] Filed: Jul. 28, 1995

[51] Int. Cl.$^6$ .................................................. G11C 17/12
[52] U.S. Cl. .......................... 365/104; 365/51; 365/184
[58] Field of Search .............................. 365/94, 103, 104, 365/184, 51, 63

[56] References Cited

U.S. PATENT DOCUMENTS

| | | | |
|---|---|---|---|
| 5,111,428 | 5/1992 | Liang | 365/104 |
| 5,117,389 | 5/1992 | Yiu | 365/104 |
| 5,295,092 | 3/1994 | Hotta | 365/51 |
| 5,467,300 | 11/1995 | Komarek | 365/104 |

Primary Examiner—David C. Nelms
Assistant Examiner—Son Mai
Attorney, Agent, or Firm—H. C. Lin

[57] ABSTRACT

The memory cells of a read-only memory are connected in parallel between adjacent bus-bit lines. The selection of tile sub-bit lines is through a selector logic decoder. The decoder has many rows of MOSFETs connected in series. Only one of MOSFETs in a row between an adjacent bit line bus and a virtual ground bus is active and controllable by a sub-word line selection signal with other MOSFETs non-conducting and connected between two adjacent sub-bit lines. These active MOSFETs in different rows are connected in series. One of these active MOSFETs is coupled to a main bit line, and another of these active MOSFETs is coupled to a virtual ground. When the active MOSFET is open, the main bit line signal and the virtual signal appear between the corresponding memory cells between these two corresponding sub-bit lines and are sensed. With this structure, the accessed memory cell is coupled between the main bit line and the virtual ground line through a number of series MOSFETs. These series MOSFETs isolate the memory cell from the main bit line, and reduces the undesirable transient lowering of the bit line signal due to parasitic capacitance which may otherwise give rise to error and slow down the speed.

4 Claims, 5 Drawing Sheets

FLAT-CELL READ-ONLY MEMORY

This invention relates read-only memory (ROM), in particular, high density, high speed read-only memory.

Conventional ROM uses a so-called "flat cell" design to achieve high density. The structure of a flat cell ROM is shown in FIG. 1 with a matrix of MOSFETs each serving as a memory cell. Each MOSFET is fabricated with either a low threshold voltage to be ON when selected or a high threshold voltage to be OFF when selected. The ON/OFF condition of the MOSFET represents the stored "0" or "1" logic level of the cell. The MOSFETs of the memory cell in a row are connected in parallel with a common gate electrode known as word line, such as XWLn0, . . . , XWLn1 to serve a control electrode of the memory cells. The vertical lines such as SBLn0 . . . SBLn1 are known as sub-bit lines and are used to read the information in the memory cells from the drain or source of the accessed MOSFET. When a particular sub-bit line such as SBLn0 is selected, an adjacent sub-bit line such as SBLn1 is set at ground potential and a charging current is switched to the selected SBLn0 sub-bit line. If the selected cell is ON, the selected sub-bit line is discharged to low ground level. If the selected cell is OFF, the selected sub-bit line is charged to a high voltage level. The resultant voltage on the selected sub-bit line is sensed by an amplifier which is referenced to a generated reference voltage.

Due to the parasitic capacitance, the total capacitance along the selected sub-bit line is the sum of the sub-bit line capacitance and the capacitance coupled through all ON MOSFET memory cells connected to the same selected sub-bit line. In the worst case, all the cells connected to this sub-bit line are in ON condition and present a large amount of capacitance on this sub-bit line.

Each sub-bit line has an effective capacitance. Under this condition when a particular sub-bit line is selected, the effective capacitance is added by the parallel capacitance coupled through a number of ON MOSFETs along the same sub-bit line. FIG. 2A shows the principle of charge sharing. The equivalent circuit is a current source charging the selected sub-bit line capacitance C1, and, through a switch SW, a capacitance C2, which represent all the capacitance coupled through all the ON MOSFETs connected to the same selected sub-bit line. The change in voltage across C1 is V1, and the change in voltage across C2 is V2. The output voltage V0 is outputted from a sense amplifier AMP connected to the bit line. Due to charge sharing effect, V1 momentarily drops before it is charged to its correct final value again, as shown in FIG. 2B. This temporary error signal D is related to the charging current I and the capacitance C1, C2.

SUMMARY

An object of this invention is to improve the structure of a ROM to limit the parasitic capacitance to a very small region, so that the charge sharing effect of the adjacent Junction capacitance and stray capacitance of the metal lines is minimized and the temporary transient error is overcome. Another object of this invention is to provide a high density ROM matrix structure to reduce area.

These objects are achieved by coupling a metal bit line to a number of sub-bit lines through N number of MOSFETs to minimize the charge sharing effect. These MOSFETS are connected as a decoder selector function block. There are N rows in this decoder, each row having N MOSFETs and controlled by a sub-word line signal. There are N MOSFETs in each row, all except one are not controllable by the gate controlled signal to conduct. The active MOSFET, which can be controlled by the gate voltage, is connected between two adjacent sub-bit lines and is staggered with respect to other active MOSFETs so that there is only one active MOSFET connected between any two adjacent sub-bit lines. The active MOSFETs in the different rows are connected in series. One of the active MOSFET is coupled to a main bit line and another active MOSFET is coupled to a virtual ground.

In another feature of this invention, the metal lines for two adjacent bits are placed next to each other, and the metal lines of two virtual ground lines for two adjacent bits are placed next to each other, so that a pair of bit lines and a pair of virtual ground lines are alternately placed. This back-to-back organization further reduces the charge sharing effect. The pairing of the metal lines for bit line signals and the pairing of virtual ground line is controlled by an Address Left/Right signal.

DETAILED DESCRIPTION OF THE PREFERRED EMBODIMENT

Figure 3:
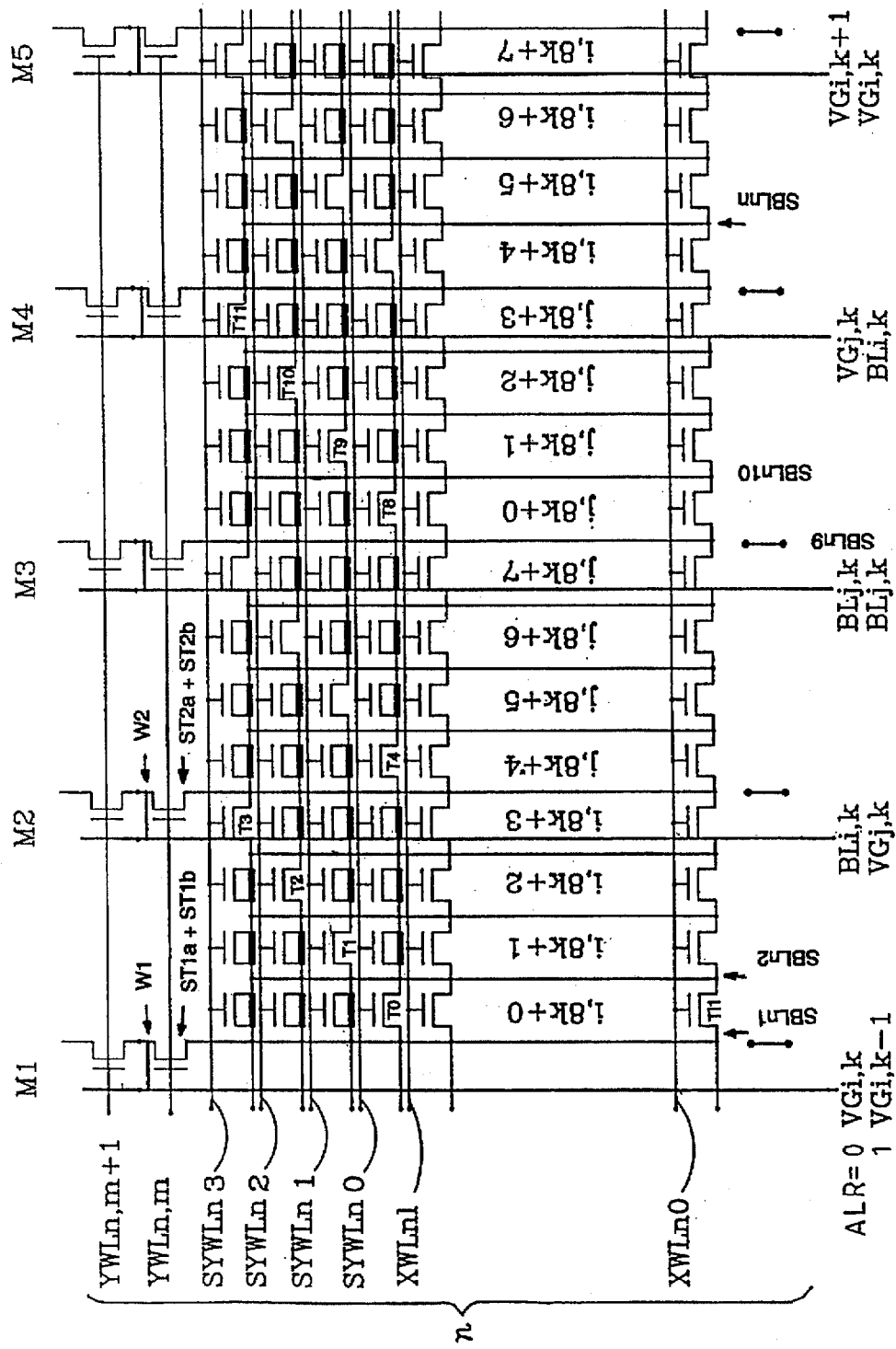
FIG. 3 shows the back-to-back arrangement of the memory cells, based on this invention.

The schematic diagram of the present invention is shown in FIG. 3. YWLn,m and YWLn,m+1 are Y-select word lines. In addition, there are sub-Y-select lines SYWLn0, SYWLn1, SYWLn2, SYWLn3. The X-select lines are XWLn0, . . . , XWLn1. The main bit lines are BLi,k and BLj,k. The virtual ground lines are VGi,k and VGj,k. The metal lines, which can serve as the bit lines or the virtual ground lines, are M1, M2, M3, M4, M5.

The ALR (which stands for Address Left/Right) signal selects the appropriate bit line and virtual ground to the metals according to the following tabulation:

|       | Bit line | Virtual ground | Cell selected to read |
|-------|----------|----------------|-----------------------|
| ALR=0 | M2=BLi   | M1=VGi         | bit i cell selected by SYWLn0~3 |
|       | M3=BLj   | M4=VGj         | bit j cell selected by SYWLn0~3 |
| ALR=1 | M3=BLj   | M2=VGj         | bit i cell selected by SYWLn0~3 |
|       | M4=BLi   | M5=VGi         | bit j cell selected by SYWLn0~3 |

In general, the ALR signal selects the bit line and virtual ground relationship. With four sub-word lines SYWLn0~3, there can be a period of eight columns of cells, which can be accessed. The cells in the different columns are labeled 8K+0, 8K+1, 8K+2, 8K+3, 8K+4, 8K+5, 8K+6, 8K+7. The cells corresponding to bit i are labeled (i,8K+0) . . . (i,8K+7); the cells corresponding to bit j are labeled (j,8K+0) . . . (j,8K+7). Note that in this invention, the metal lines for two successive bit lines are placed next to each other, e.g. BLi,k and BLj,k; the metal lines for two successsive virtual ground lines are also placed next to each other, e.g. VGj,k and VGi,k+1, forming a back-to-back organization.

The sub-word lines are connected to a MOSFET matrix serving as decoders. Each sub-word line is connected to the gates of the MOSFETs connected in series on a same row. Only two of MOSFETs out of the a period of eight MOSFETs are active in that the other six MOSFETs are dummys which cannot be turned on due to heavy ion implantation in the channels. For instance, in the row which SYWLn0 controls, only T0 and T4 can be turned on or off. The active MOSFETs are placed above different cell columns for different rows of sub-word lines. All the nodes between two series MOSFETs in the same column are connected together to form a sub-bit line, such as SBLn1, SBLn2, . . . SBLnn.

When a sub-word line such as SYWLn,0 is at "0" level and the rest of the sub-word lines are high at "1" level, the active MOSFET T0 is OFF, and the rest of the active MOSFETs T1, T2, T3 are ON. For the ALR=0 condition, the BLi,k signal passes through M2, the word line YWLn,m controlled ST2a+ST2b, T3, T2, T1 and appears on the sub-bit line SBLn2. The virtual ground VGi,k signal passes through the word line YWLn,m controlled ST1a+ST1b, the bit line SBLn1. Since T0 is opened by the sub-word line signal SYWLn0, the bit line signal BLi,k and the virtual ground signal VGi,k appears across all the memory cells in the column i,8K+0. When a word line control signal, say XWLn0, turns on the bottom row, the memory cell Ti1 is accessed. If Ti1 is ON, the charging current from BLi,k flows through Ti1 to the virtual ground VGi,k, dropping the sub-bit line SBLn2 to ground potential. If Ti1 is OFF, the sub-bit line SBLn2 is charged to a high potential. The high or low potential on SBLn2 is then sensed by a sense amplifier.

Similarly, the signals on the metal lines M3 and M4 operate in a symmetrical manner in that the virtual ground signal VGj,k, instead of the bit line signal BLj,k, passes through the active transistors T11, T10, T9 to appear on one side of T8 (i.e. sub-bit line SBLn10) while the bit line signal BLj,k appears directly on the other side of T9 (i.e. sub-bit line SBLn9). Then, the sub-bit line SBLn9 is high if the accessed memory, as controlled by word line, is OFF and vice versa.

With this back-to-back bit-line arrangement, the accessed memory cell is connected to one of the metal line through four MOSFETs in series, thus isolating and reducing the effect of stray capacitance of that particular metal line. The four different situations are as follows:

| Bit i | Bit j | Current conduction | Bit line potential | Transient signal |
|---|---|---|---|---|
| ON | ON | 2 sides | BLi lo,BLj lo | normal |
| ON | OFF | 1 side | BLi lo,BLj hi | BLj lowers |
| OFF | ON | 1 side | BLi hi,BLj lo | BLi lowers |
| OFF | OFF | none | BLi hi, BLj hi | normal |

Figure 1:
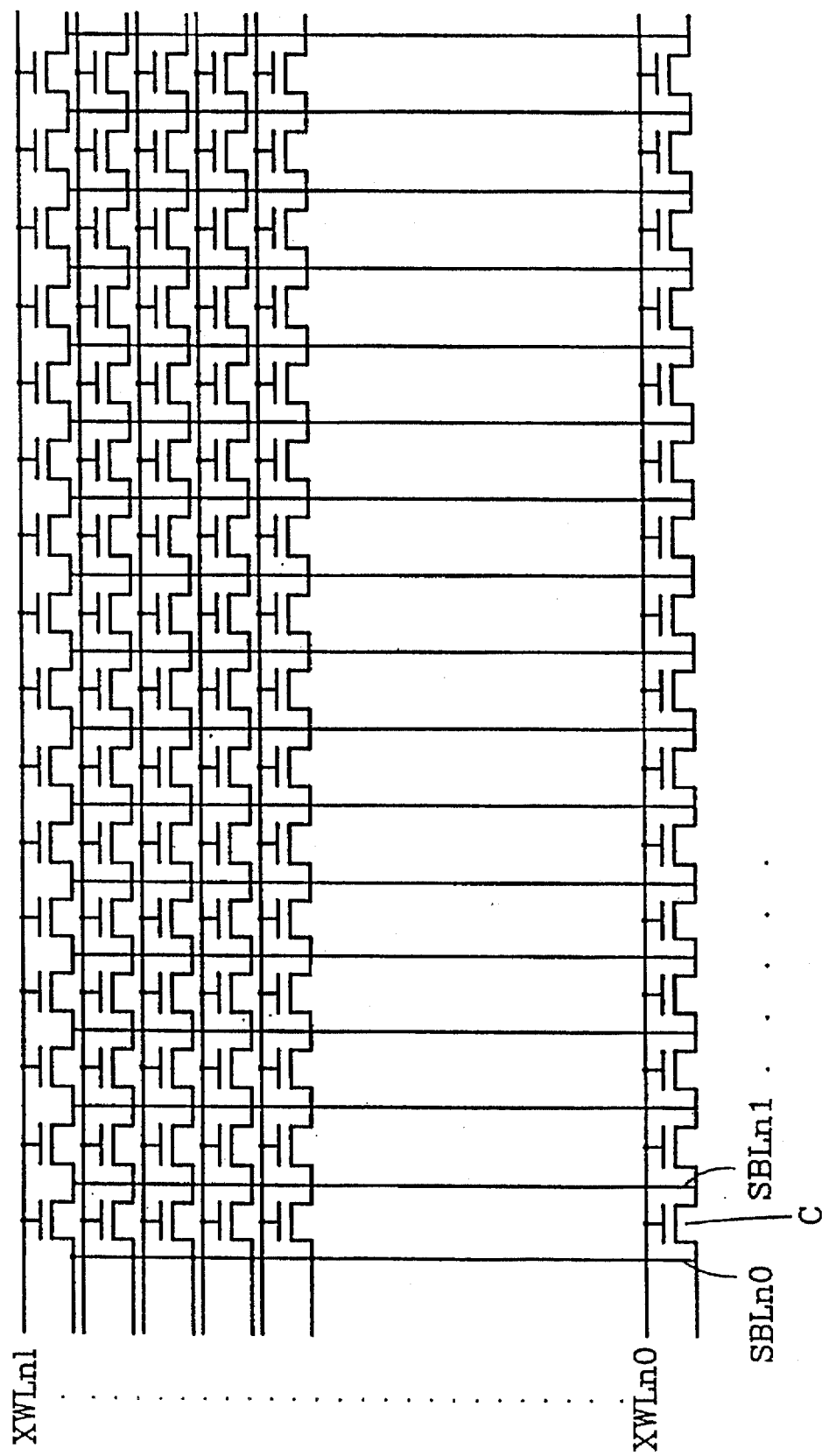
FIG. 1 shows a traditional flat-cell ROM structure.
Figure 2A:
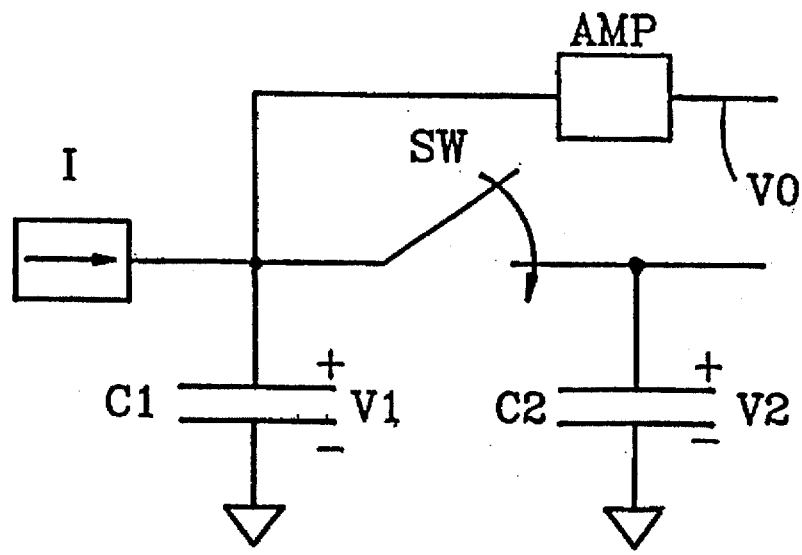
FIG. 2A shows the equivalent circuit of charge redistribution.
Figure 2B:
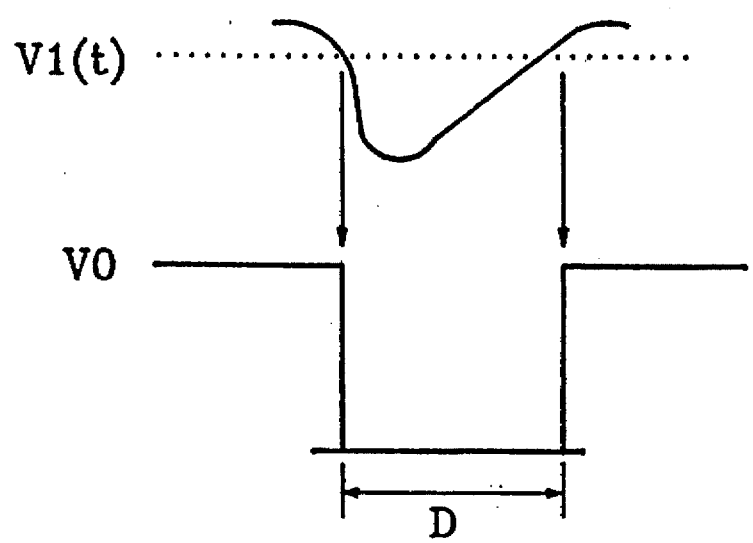
FIG. 2B shows the transient variation of voltage across a selected transistor.

In this invention, Bit i and Bit j are simultaneously charged. This operation is different from the conventional design in which either i or j is charged one at a time. The transient lowering of the BLi and BLj signals is much improved over conventional arrangement shown FIG. 1, because the stray capacitance on the sub-bit lines is much reduced. Due to the reduction of transient sub-bit line voltage, the operation can be speeded up without waiting for the transient voltage to recover.

According to the foregoing description of the memory cell for ALR=0, (Y-select line:YWLn,m; sub-Y select line:SYWLn,0; X-select line: XWLn,0), it can be deduced that:

reading path of cell i: M2→M1 reading path of cell j: M3→M4

The schematic diagram is a back-to-back structure. This method of reading the memory cell can be seen from the columns i,8k+0 and j,8k+0.

The metal line M1–M5 can be connected to sense amplifiers or to virtual ground with a potential Vss, as defined by the ALR signal. Basically, this invention maintains a back-to-back structure for reading a memory cell. In this structure, the sense amplifier can directly compare the information of cell i and cell j without requiring any reference voltage.

There are six MOSFETs in series between the bit line and the virtual ground (four in the decoder matrix and two controlled by the word line). The column of bits is selected by the sub-Y-select lines (SYWLn0, SYWLn1, SYWLn2, SYWLn3). The corresponding selected cells are tabulated in the following table:

| ALR | SYWLn3 | SYWLn2 | SYWLn,1 | SYWLn0 | Location of cells be read |
|---|---|---|---|---|---|
| 0 | 1 | 1 | 1 | 0 | i,8k+0 or j,8k+0 |
| 0 | 1 | 1 | 0 | 1 | i,8k+1 or j,8k+1 |
| 0 | 1 | 0 | 1 | 1 | i,8k+2 or j,8k+2 |
| 0 | 0 | 1 | 1 | 1 | i,8k+3 or j,8k+3 |
| 1 | 1 | 1 | 1 | 0 | i,8k+4 or j,8k+4 |
| 1 | 1 | 1 | 0 | 1 | i,8k+5 or j,8k+5 |
| 1 | 1 | 0 | 1 | 1 | i,8k+6 or j,8k+6 |
| 1 | 0 | 1 | 1 | 1 | i,8k+7 or j,8k+7 |

The number of series connection of MOSFETs in the decoder matrix can be increased from 4 to a larger number such as 8, 16 etc.

The features of this invention are:

(1) the ith bit cells and the jth bit cells are alternately placed. As shown in FIG. 3, the first 4 columns are i cells, the next 8 columns are j cells and the last 4 columns are i cells again.

(2) the path for reading the ith bit cells and the path for reading the Jth bit cells are back-to-back, in that the BLi,k signal travels from right-side to left-side and the BLj,k signal travels from left-side to right-side. The series MOSFETs reduces the coupling of metal bit line capacitance to the memory.

(3) Between the bit line and the corresponding virtual ground are a number of series MOSFETs connected as 1 of N decoder. The number of series MOSFETs determines the pitch ratio of the metal lines and the buried diffusion sub-bit lines. The larger this ratio, the fewer is the number of metal lines and the easier it is to design the periphery bit-line selection circuit. This flexibility optimizes the electrical characteristics and reliability.

(4) Doubling the width of the Y-select MOSFET, i.e. parallel arrangement of two transistors ST1a and ST1b, makes it easy to read the "0" logic level.

(5) The memory cell array is connected on one side to the metal bit line and the other end to the metal virtual ground. The connection uses the simpliest arrangement to have these two select lines be placed on the same side.

In the arrangement of the present invention, the number of contact windows for the bit metal lines and the virtual ground metal lines are based on 1 of N decoding. There is no need to provide a contact window for every sub-bit line.

As shown in FIG. 3, the memory cells, corresponding to a particular sub-Y select and the X-select, are connected in parallel between the sub-bit lines such as (SBLn0, SBLn1, ...). The MOSFETs ST1a, ST1b are connected in parallel and controlled by the Y-select word line YWLn,m. The YWLn,m+1 is a Y select word line which functions exactly the same as YWLn,m for another set of decoder matrix above FIG. 3 and not shown. The SBn1a, SBn1b sub-bit lines are connected to the signal lines through the contact windows. The diffusion area under the contact window can be implemented by source/drain diffusion or alternatively diffusion, depending on process uniformity.

Figure 4:
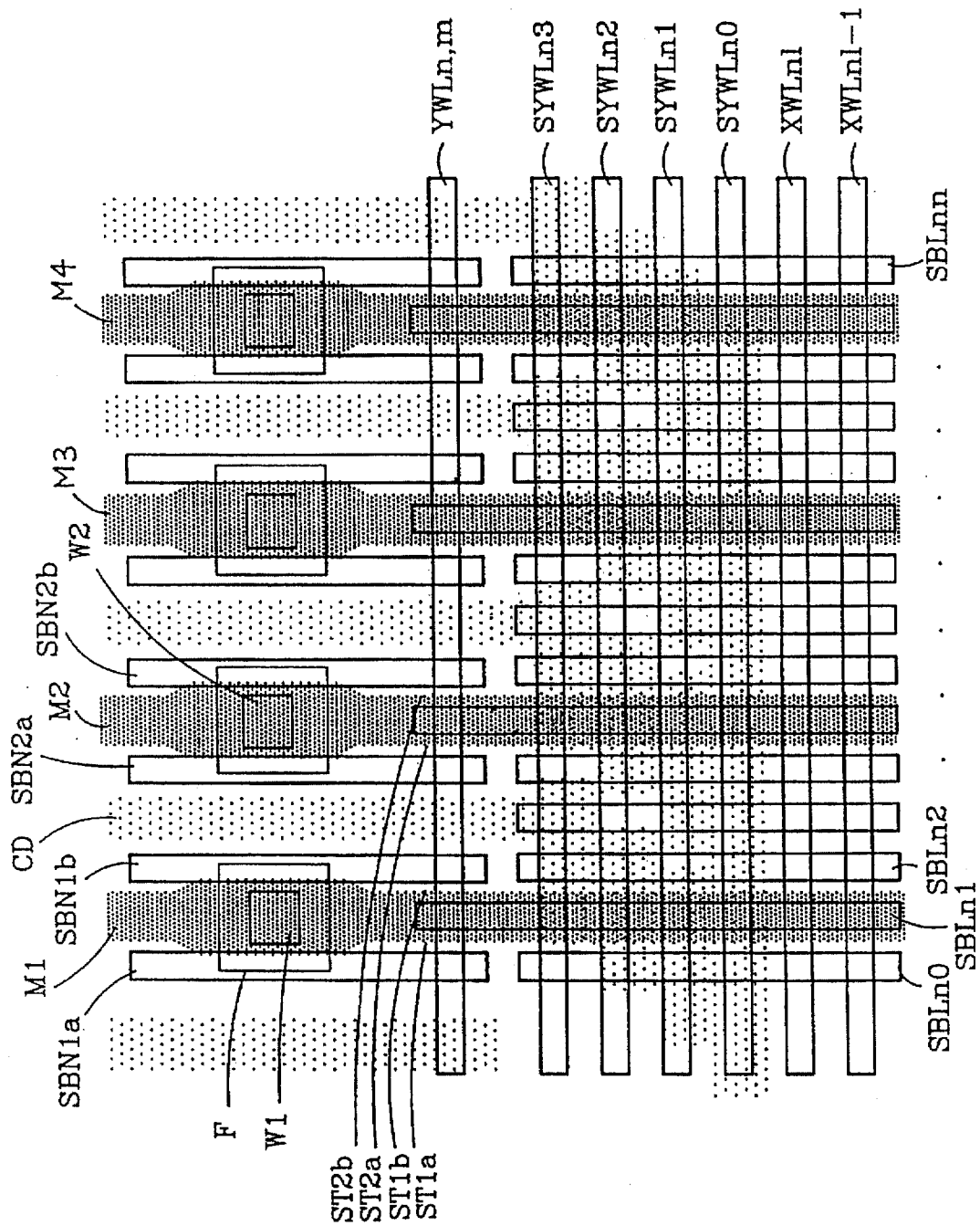
FIG. 4 shows the top-view of the layout of the present invention.

FIG. 4 shows the top view layout of the present invention, showing how a Y-selected MOSFET provides a path from the memory matrix to the bit line or the virtual ground. The Y-select ST1a, ST1b select transistors are formed between the diffusions SBN1a, SBN1b and the sub-bit line SBLn1 diffusion. The connection between the memory cell and the metal line through the Y-select MOSFET is made through a contact in a heavily doped diffusion F which bridges the two sub-bit line diffusions SBN1a and SBN1b. The Y-select MOSFET in FIG. 3 is actually composed of two MOSFETs ST1a and ST1b in parallel to reduce the on resistance and the charging time. The metal lines are either connected to a bit line or a virtual ground line. Between the metal lines are ion implanted with channel stops CD to isolate the neighboring MOSFETs such as ST1b, ST2a.

Figure 5:
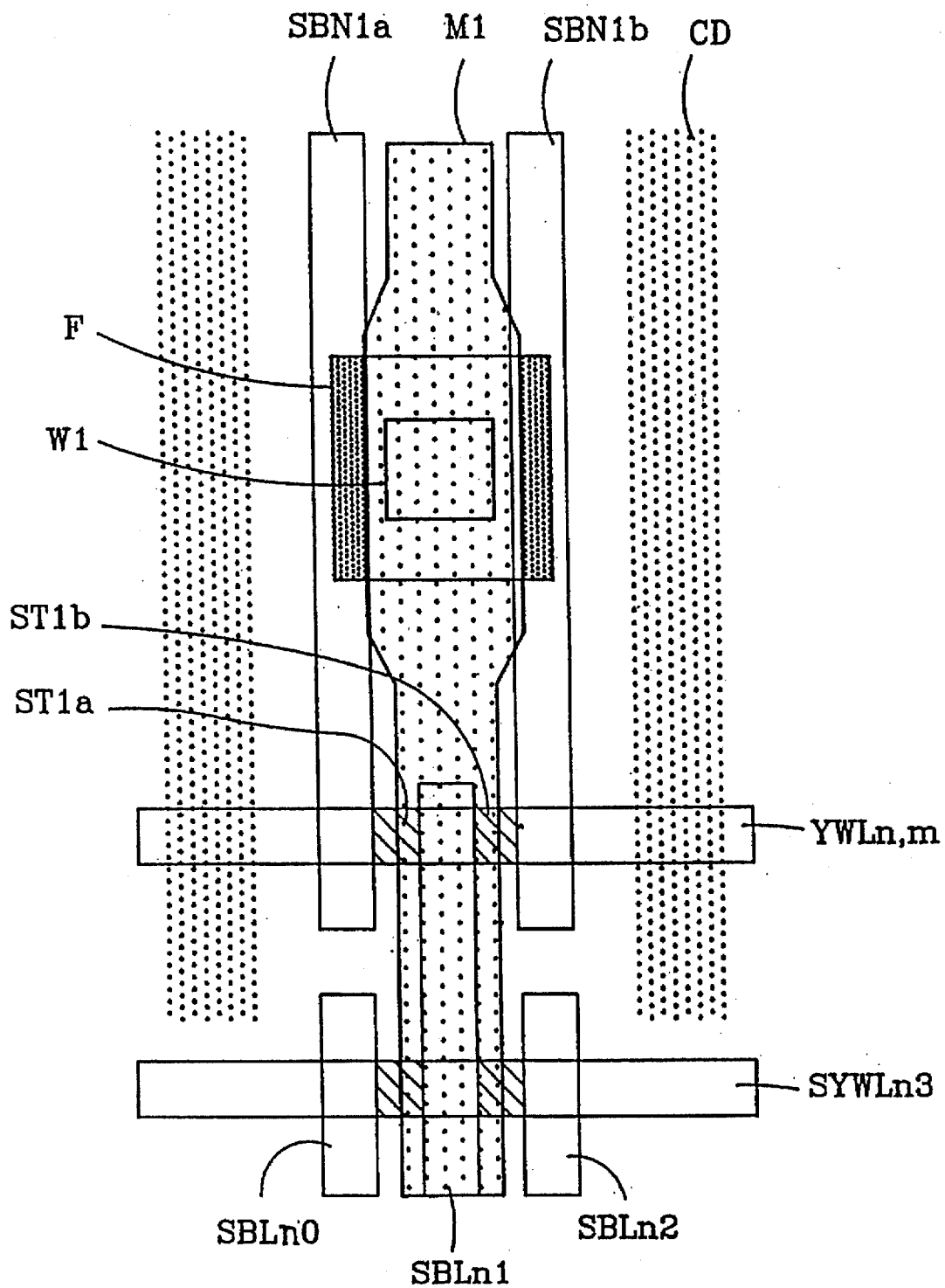
FIG. 5 shows an enlarged view of FIG. 4, showing the detailed connection of the memory cell bit line and ground.

FIG. 5 is an enlarged view of one metal line in FIG. 4, together with associated diffusions, Y-select word line YWLn,m and sub-Y select word line SYWLn3. The Y-select MOSFETs ST1a and ST1b are connected in parallel to effectively double the gate width and to provide greater conductance for sensing current to flow. The MOSFETS ST1b, ST1a, the MOSFETs in the decoder matrix such as those controlled by SYWLn3 and the MOSFETs in the memory cell matrix are all in the same active region bounded vertically by the diffusions SBLn0 and SBLn2. The diffusion area under the contact window can be implanted by source/drain diffusion or alternately N+ diffusion, depending on process uniformity.

The foregoing description discloses a high density, high speed read-only memory structure, which reduces the charge sharing effect. Hence the transient error is minimized, the reading speed is enhanced, and the noise immunity is improved.

What is claimed is:

1. A semiconductor read-only memory comprising:

a plurality of sub-bit lines;

a plurality of groups of memory cells arranged in a matrix of MOSFETs with a common gate for each row connected to one of multiple word-lines, in each one of said groups, said memory cells being electrically connected in parallel as a column between two adjacent said sub-bit lines;

main bit line for main bits, the number of which being less than one half of the number of said sub-bit lines with a ratio of 1:N, where N is a binary weighted integer larger than 1;

a group of selector pass transistor switches functioning as a decoder to select one of said sub-bit lines to be coupled to one of said main bit lines;

a first sub-decoder for i bit information, having first half i matrix MOSFETs and a second half i matrix MOSFETs; and a second sub-decoder for j bit information having first half j matrix MOSFETs and a second half j matrix MOSFETs, wherein said second half j matrix MOSFETs are arranged between said first half i matrix MOSFETs and said second half i matrix MOSFETs, and said first half j matrix MOSFETs are arranged between said second half j matrix MOSFETs and said second half i matrix MOSFETs, and the source/drain of said first half i matrix MOSFETS and second j matrix MOSFETs is arranged in a first direction for main bit line signal to flow to a first virtual ground, and the source/drain of said first half j matrix MOSFETs and said second half i matrix MOSFETs is arrange for an adjacent main bit line signal to flow to a second virtual ground in a direction opposite to said first direction.

2. A semiconductor read-only memory comprising, a plurality of sub-bits lines;

a plurality of groups of memory cells arranged in a matrix of MOSFETs with a common gate for each row connected to one of multiple word-lines, in each one of said groups, said memory cells being electrically connected in parallel as a column between two adjacent said sub-bit lines;

main bit lines for main bits, the number of which being less than one half of the number of said sub-bit lines with a ratio of 1:N, where N is a binary weighted integer larger than 1;

a group of selector pass transistor switches functioning as a decoder to select one of said sub-bit lines to be coupled to one of said main bit lines, wherein said decoder comprises:

N parallel rows of MOSFETs connected in series, only one active MOSFET in each one of said rows of one of said groups being controllable by a common gate of said MOSFETs with a sub-word line signal for each of said rows such that the number of said active MOSFET between said main bit line and an adjacent virtual ground line is N, other said MOSFETs than said active MOSFET being not conducting, said active MOSFET in each of said rows being connected between adjacent said sub-bit lines, and staggered with respect to each other so that said active MOSFET in each of said rows is not connected to the same adjacent, said sub-bit lines, said active MOSFET in each of said rows being connected in series with another active MOSFET in a different row, one said active MOSFET being coupled to one said main bit line and a second active MOSFET being coupled to virtual ground line, wherein aid main bit line is a first metal line and said virtual group line is a second metal line, said first metal line and said second metal line being placed adjacent to each other and exchanging functions from time to time.

3. A semiconductor read-only memory as described in claim 2, wherein:

said first metal line and said second line are coupled through a word-line controlled MOSFET, the metal line for one main bit line and metal line for a next bit line are placed adjacent to each other, and the metal line of the virtual ground for one main bit line and the metal line of the virtual ground for a next bit line are placed next to each other, so that a pair of bit lines and pair of virtual ground lines are alternately placed, and the selection of the metal line for said one main bit line and the selection of the metal line for said virtual ground are controlled by an Address Left/Right signal.

4. A method to eliminate transient error in a read-only memory having a plurality of series matrix MOSFETs as memory cells, a plurality of selector pass transistor switches functioning as a decoder to sense the on/off states of the matrix MOSFETs, a plurality of metal lines each serving as a main bit line or a virtual ground line, determined by an address left/right selector, coupled to the decoder, comprising the steps of:

placing both a first and a second matrix MOSFETs in sequence between first said main bit line and first said virtual ground line so that the signal from first said main bit line flows toward first said virtual ground in a first direction; and placing both a third and fourth matrix MOSFETs between said metal lines so that the signal flows from an adjacent second main bit line to a second said virtual ground in an opposite direction to the first direction, wherein when said address left/right selector is in a first state, one of the decoder is selected, the matrix MOSFETs of the first matrix ahead of said selected decoder is sensed through one of said metal lines, and the matrix MOSFETs of the third matrix MOSFETs following the selected decoder is sensed through a different one of said metal lines while the matrix MOSFETs of the second and fourth matrix are idle, and when said address left/right selector is in a second state, one of the decoder is selected, the matrix MOSFETS of the second matrix ahead of said selected decoder is sensed through one of said metal lines, and the matrix MOSFETs of the fourth matrix following the selected decoder is sensed through a different one of said metal lines while the matrix MOSFETs of the first and third matrix are idle.

* * * * *